United States Patent
Maruhashi

[11] Patent Number: 5,847,608
[45] Date of Patent: Dec. 8, 1998

[54] AMPLIFIER CIRCUIT OPERATING WITH SINGLE BIAS SUPPLY AND LESS SENSITIVE TO FLUCTUATION OF THRESHOLD

[75] Inventor: Kenichi Maruhashi, Tokyo, Japan

[73] Assignee: NEC Corporation, Tokyo, Japan

[21] Appl. No.: 767,726

[22] Filed: Dec. 16, 1996

[30] Foreign Application Priority Data

Dec. 15, 1995 [JP] Japan .................................. 7-326927

[51] Int. Cl.$^6$ .................................................. H03F 3/193
[52] U.S. Cl. ........................ 330/277; 330/286; 330/296
[58] Field of Search .................................. 330/277, 286, 330/296

[56] References Cited

U.S. PATENT DOCUMENTS 4,590,436  5/1986  Butler et al. ...................... 330/296 X
5,548,247  8/1996  Ogino et al. ....................... 330/296 X

OTHER PUBLICATIONS

Brian Hughes, Julio Perdomo, Hiroshi Kondoh; 12 GHZ Low Noise MMIC Amplifier Designed with a Noise Model that Scales with MODFET Size and Bias; Dec. 1993; pp. 2311–2316.

Primary Examiner—James B. Mullins

[57] ABSTRACT

An amplifier circuit is powered by a single power voltage source connected to a drain node of a field effect transistor, and a series of a resistor and a diode produces a gate bias voltage from the power voltage at the single power voltage source so as to increase the resistance of a resistor connected to the source node of the field effect transistor, thereby decreasing a sensitivity of drain current to undesirable variation of the threshold voltage.

4 Claims, 7 Drawing Sheets

AMPLIFIER CIRCUIT OPERATING WITH SINGLE BIAS SUPPLY AND LESS SENSITIVE TO FLUCTUATION OF THRESHOLD

FIELD OF THE INVENTION

This invention relates to an amplifier circuit and, more particularly, to an amplifier circuit implemented by a depletion type field effect transistor operating with a single bias supply less sensitive to fluctuation of a threshold voltage.

DESCRIPTION OF THE RELATED ART

A typical example of the amplifier circuit is illustrated in FIG. 1. The prior art amplifier circuit comprises a depletion type field effect transistor 1. The depletion type field effect transistor 1 has a gate electrode 1a, a drain electrode 1b and a source electrode 1c. The depletion type field effect transistor 1 is responsive to a gate potential Vg at the gate electrode 1a for controlling a drain current Id and a source current Is.

The gate electrode 1a is connected to an input matching circuit 2, and the input matching circuit 2 has transmission lines 2a and 2b one of which is connected through a capacitor 3a to a signal input terminal IN and the other of which is directly connected to a ground line GND. An input signal Sin is applied to the input terminal IN, and the capacitor 3a removes a direct-current component from the input signal Sin.

The drain electrode 1b is connected to an output matching circuit 4, and the output matching circuit 4 has transmission lines 4a and 4b one of which is connected through a capacitor 3b to an output terminal OUT and the other of which is connected to a power supply line Vd. The power supply line Vd is further connected through a capacitor 3c to the ground line GND. The capacitor 3b removes a direct-current component from an output signal Sout, and the capacitor 3c discharges an alternating-current component to the ground line GND.

The source electrode 1c is connected to a resistor 3d and a capacitor 3e, and the resistor 3d and the capacitor 3e are connected in parallel to the ground line GND. The source current Is flows through the resistor 3d into the ground line GND, and the resistor 3d applies a source potential Vs to the source electrode 1c. The capacitor 3e discharges the alternating-current component to the ground line GND. The resistor 3d is selected in such a manner that the source potential Vs is greater than the gate potential Vg, and the field effect transistor 1 is allowed to behave in the depletion mode under the single power supply line Vd. The field effect transistor 1 is responsive to the gate voltage Vg for producing the output signal Sout magnified at a certain gain.

If the prior art amplifier circuit is fabricated on a circuit board, the discrete type field effect transistor 1 and the other circuit components 2, 3a to 3e and 4 are arranged on a printed circuit board. In this instance, the gate voltage Vg is fixed as shown in FIG. 1, and the fluctuation in the threshold of the field effect transistor 1 seriously affects the amount of drain current Id. For this reason, it is required for the manufacturer to get the semiconductor devices strictly regulated to a target threshold.

On the other hand, if the prior art amplifier circuit is integrated on a semiconductor chip, fluctuation of process parameters varies the threshold of the field effect transistors 1, and it is impossible to replace the defective field effect transistor with a non-defective field effect transistor. This means that the integrated circuit is rejected as a defective product. As a result, the production yield is lowered.

SUMMARY OF THE INVENTION

It is therefore an important object of the present invention to provide an amplifier circuit which is less affected by a fluctuation in the threshold of a field effect transistor.

To accomplish the object, the present invention proposes to increase a resistance of a resistor connected to a source node of a field effect transistor.

In accordance with the present invention, there is provided an amplifier circuit operative to amplify an input signal for producing an output signal, comprising: a field effect transistor having a gate node supplied with the input signal from a signal input node, a source node for a source current and a drain node connected to a power voltage line for a drain current and supplying the output signal to a signal output node; a first resistive element connected between the source node and a constant voltage source for providing a resistance against the source current; and a gate bias circuit powered by the power voltage line, and having a diode element for applying a gate bias voltage to the gate node.

BRIEF DESCRIPTION OF THE DRAWINGS

The features and advantages of the amplifier circuit according to the present invention will be more clearly understood from the following description taken in conjunction with the accompanying drawings in which.

DESCRIPTION OF THE PREFERRED EMBODIMENTS

First Embodiment

Figure 2:
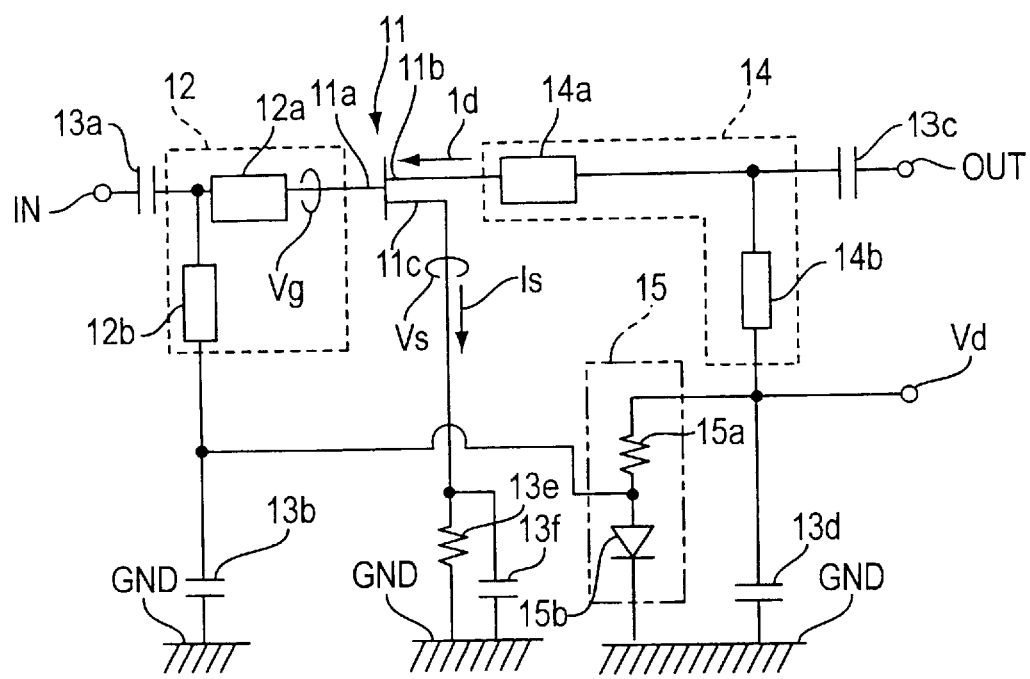
FIG. 2 is a circuit diagram showing the circuit arrangement of an amplifier circuit according to the present invention.

Referring to FIG. 2 of the drawings, an amplifier circuit embodying the present invention comprises a depletion type field effect transistor 11. The depletion type field effect transistor 11 has a gate electrode 11a, a drain electrode 11b and a source electrode 11c. The depletion type field effect transistor 11 is responsive to a gate potential Vg at the gate electrode 11a for controlling a drain current Id and a source current Is.

The gate electrode 11a is connected to an input matching circuit 12, and the input matching circuit 12 has transmission lines 12a and 12b connected through capacitors 13a and 13b to a signal input terminal IN and a ground line GND, respectively. An input signal Sin is applied to the input terminal IN, and the capacitor 13a removes a direct-current component from the input signal Sin. The capacitor 13b also aims at elimination of direct current component.

The drain electrode 11b is connected to an output matching circuit 14, and the output matching circuit 14 has transmission lines 14a and 14b connected through capacitors 13c and 13d to an output terminal OUT and the ground line GND, respectively. A power supply line Vd is further connected to the transmission line 14b. The capacitor 13c removes a direct-current component from an output signal Sout, and the capacitor 13d discharges an alternating-current component to the ground line GND.

The source electrode 11c is connected to a resistor 13e and a capacitor 13f, and the resistor 13e and the capacitor 13f are connected in parallel to the ground line GND. The source current Is flows through the resistor 13e into the ground line GND, and the resistor 13e applies a source potential Vs to the source electrode 11c. The capacitor 13f discharges an alternating-current component to the ground line GND. The source potential Vs is greater than the gate potential Vg, and the field effect transistor 11 is allowed to behave in the depletion mode.

The amplifier circuit further comprises a gate bias circuit 15 for applying a constant potential Vf to the gate electrode 11a. The bias circuit includes a resistor 15a and a diode 15b connected in series between the power supply line Vd and the ground line GND. An intermediate node between the resistor 15a and the diode 15b is connected to the transmission line 12b, and the diode 15b applies the forward turn-on voltage Vf through the input matching circuit 12 to the gate electrode 11a. In this instance, the diode 15b is a Schottky diode. The resistor 15a restricts the current flowing through the diode 15b to the ground line GND. The resistor 13e is selected in such a manner that the source potential Vs is greater than the gate potential Vg, and the field effect transistor 11 is operable in the depletion mode under the single power supply source Vd. The capacitors 13a, 13b, 13d and 13f are used for an ac coupling, 13b, 13c, 13d and 13f, and only the field effect transistor 11, the resistor 13e and the diode 15b of the gate bias circuit 15 are the basic circuit component of the ideal amplifier circuit.

The amplifier circuit according to the present invention may be fabricated on a printed circuit board or a single semiconductor chip. When the depletion type field effect transistor 11 is integrated on the single semiconductor chip together with other circuit components, the integrated circuit may have the layout shown in FIG. 3.

Figure 3:
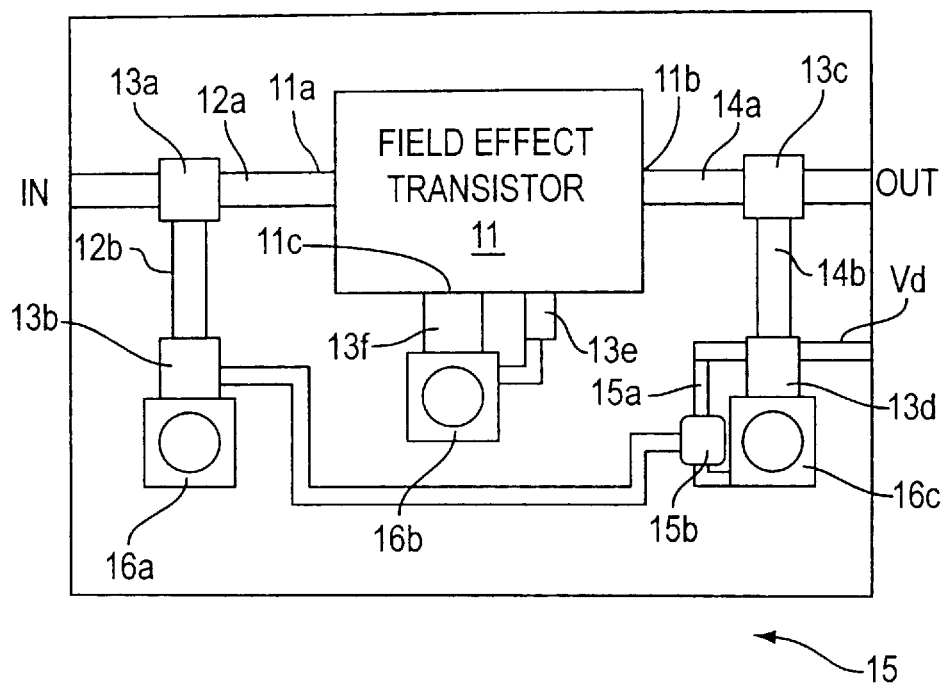
FIG. 3 is a plan view showing the layout of the amplifier circuit fabricated on a single semiconductor chip.

In FIG. 3, the depletion type field effect transistor 11 is represented by a rectangualar area, and the capacitor 13b, the resistor 13e/capacitor 13f, the diode 15b and the capacitor 13d are connected through via-holes 16a, 16b and 16c to a back plate (not shown) on the reverse surface of the semiconductor chip. The back plate is corresponding to the ground line GND in FIG. 2.

Subsequently, description is made on the gate bias circuit featuring the amplifier circuit according to the present invention. The relation among the drain current Id, the gate potential Vg, the source potential Vs and the threshold Vth of a field effect transistor is approximated by equation 1.

$$Id = (\text{beta})(Vg - Vs - Vth)^2 \qquad \text{Equation 1}$$

where beta is a fitting factor. If a resistor is connected between the source electrode and a ground line, the source potential Vs is expressed as follows.

$$Vs = R \times IS \approx R \times Id \qquad \text{Equation 2}$$

where R is the resistance provided by the resistor. Substituting equation 2 into equation 1 yields a quadratic equation, and solve the quadratic equation for the drain current Id.

$$Id = (Vg - Vth)/R + \{1/(R^2 \times 2 \times \text{beta})\}[1 - \{1 + 2R \times 2 \times \text{beta} \times (Vg - Vth)\}^{1/2}] \qquad \text{Equation 3}$$

where Id or Vs is equal to zero when Vg is changed to Vth. Let us define a sensitivity of the drain current Id to the threshold voltage Vth as a differential coefficient expressed as follows.

$$\partial Id/\partial Vth = (-1/R)[1 - \{1 + 2R \times 2 \times \text{beta} \times (Vg - Vth)\}^{-\frac{1}{2}}] \qquad \text{Equation 4}$$

In equation 4, the sensitivity $\partial Id/\partial Vth$ is less affected by the second term. For example, if R is 22 ohms, beta is 0.2 A/V$^2$, Vg is zero and Vth is −0.6 volt, the second term affects the sensitivity at 29 percent of the first term. When the resistance R gets larger, the influence of the second term begins to get smaller. In this situation, equation 4 is approximated as follows.

$$\partial Id/\partial Vth \approx -1/R \qquad \text{Equation 5}$$

Equation 5 teaches us that the sensitivity to the fluctuation in threshold Vth is improved by increasing the resistance R. In other words, even if the threshold Vth fluctuates, a large resistance R restricts the fluctuation of the drain current Id.

If the resistor 3d of the prior art amplifier circuit has the resistance Rc, i.e., R=Rc, the drain current Id0, the fitting factor beta and the threshold Vth determine Rc, and equation 1 is rewritten into equation 6.

$$Id0 = \text{beta} \times (-Rc \times Id0 - Vth)^2 \qquad \text{Equation 6}$$

On the other hand, the gate bias circuit 15 biases the gate potential Vg fixed to the forward turn-on voltage Vf, and the drain current Id0 is expressed as $$\begin{aligned} Id0 &= \text{beta} \times (Vf - Rp \times Id0 - Vth)^2 \qquad \text{Equation 7}\\ &= \text{beta} \times \{-(Rp\ Vf/Id0) \times Id0 - Vth\}^2 \end{aligned}$$

where Rp is corresponding to the resistance R for the amplifier circuit according to the present invention. From equations 6 and 7, relation between Rp and Rc is given by equation 8.

$$Rp = Rc + Vf/Id0 \qquad \text{Equation 8}$$

If a field effect transistor has the fitting factor beta of 0.2 A/V$^2$, the threshold Vth of −0.6 volt and is expected to behave at Id0=15 mA and Vf is 0.8 volt, equation 6 gives the resistance Rc of 22 ohms to the resistor 3d, and equation 7 determines the resistance Rp to be 75 ohms by virtue of the diode 15b. Thus, the resistance Rp is 3.4 times larger than the resistance Rc, and the large resistance Rp decreases the sensitivity to the fluctuation of the threshold to a third of the sensitivity of the prior art amplifier circuit.

As will be understood from the foregoing description, the diode 15b causes the manufacturer to increase the resistance Rp of the resistor 13e, and the large resistance Rp restricts the sensitivity of the drain current Id to the fluctuation of threshold voltage. The low sensitivity to the fluctuation of threshold allows the manufacturer to use a field effect transistor with the threshold voltage out of the admittable range of the prior art. If the amplifier circuit according to the present invention is fabricated on a single semiconductor chip, the diode 15b is fabricated through the same process as the field effect transistor 11, and the fabrication process is never complicated, and the occupation area of the diode 15b is negligible.

Figure 1:
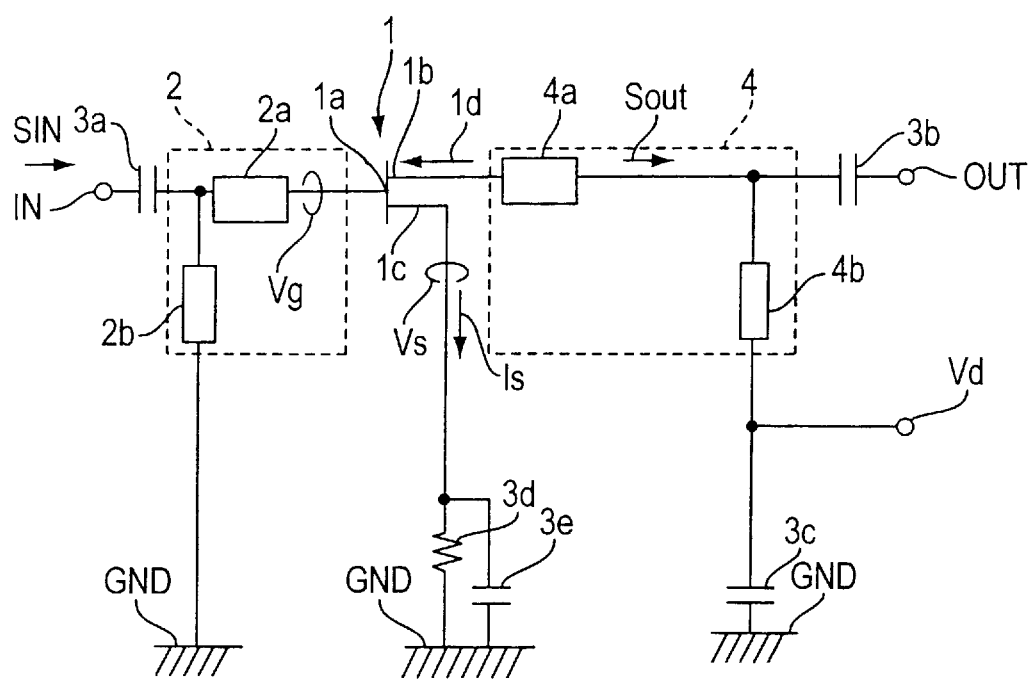
FIG. 1 is a circuit diagram showing the circuit arrangement of the prior art amplifier circuit.
Figure 4:
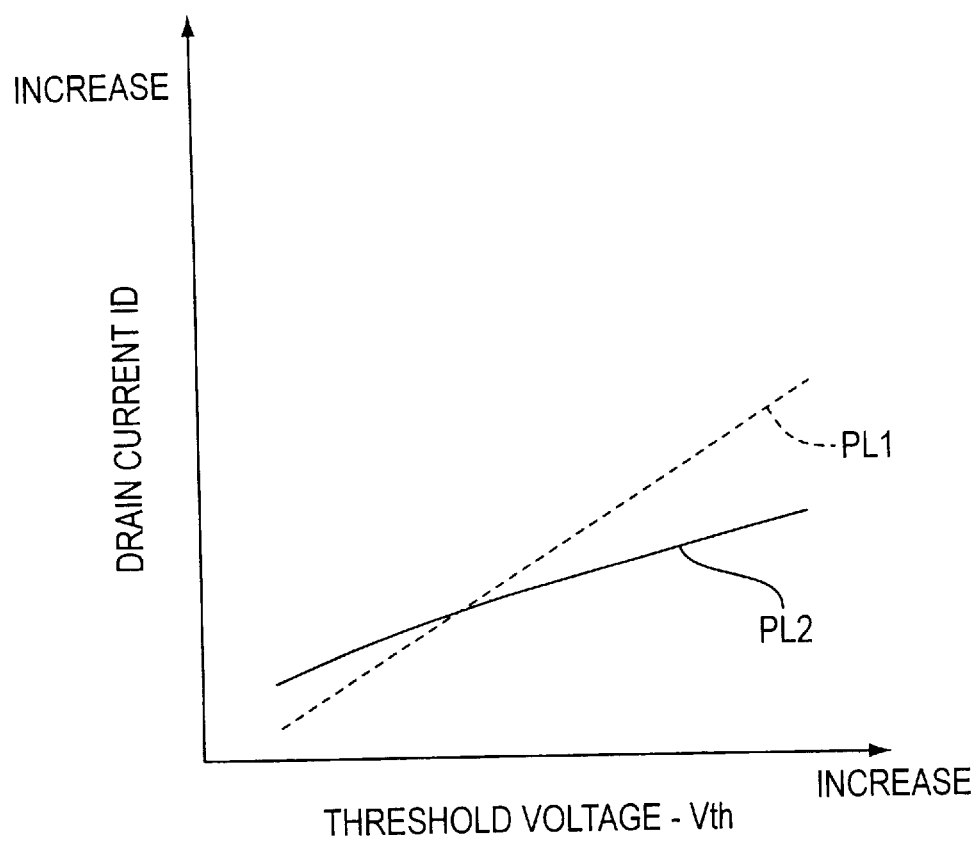
FIG. 4 is a graph showing variation of drain current in terms of the threshold of the field effect transistor.

The present inventor confirmed the improvement of the sensitivity. The present inventor prepared the prior art amplifier circuit shown in FIG. 1 and the amplifier circuit according to the present invention, and measured the drain current Id for different threshold voltage Vth. The drain current Id for the prior art amplifier circuit and the drain current Id for the amplifier circuit of the present invention were plotted indicated by broken line (PL1) and real line (PL2) in FIG. 4. Comparing plots PL1 with plots PL2, the range of drain current Id for the amplifier circuit of the present invention was narrower than the range of drain current Id for the prior art amplifier circuit.

When a field effect transistor is operating in the saturated region under a constant gate potential Vg, it is known that the fluctuation of drain current Id to drain voltage Vd is small. Although the gate bias is changed from zero to Vf in the amplifier circuit according to the present invention, the forward turn-on voltage Vf is almost constant with respect to the power voltage Vd, and the fluctuation of drain current Id to drain voltage Vd is on the same level as the prior art amplifier circuit.

Second Embodiment

Figure 5:
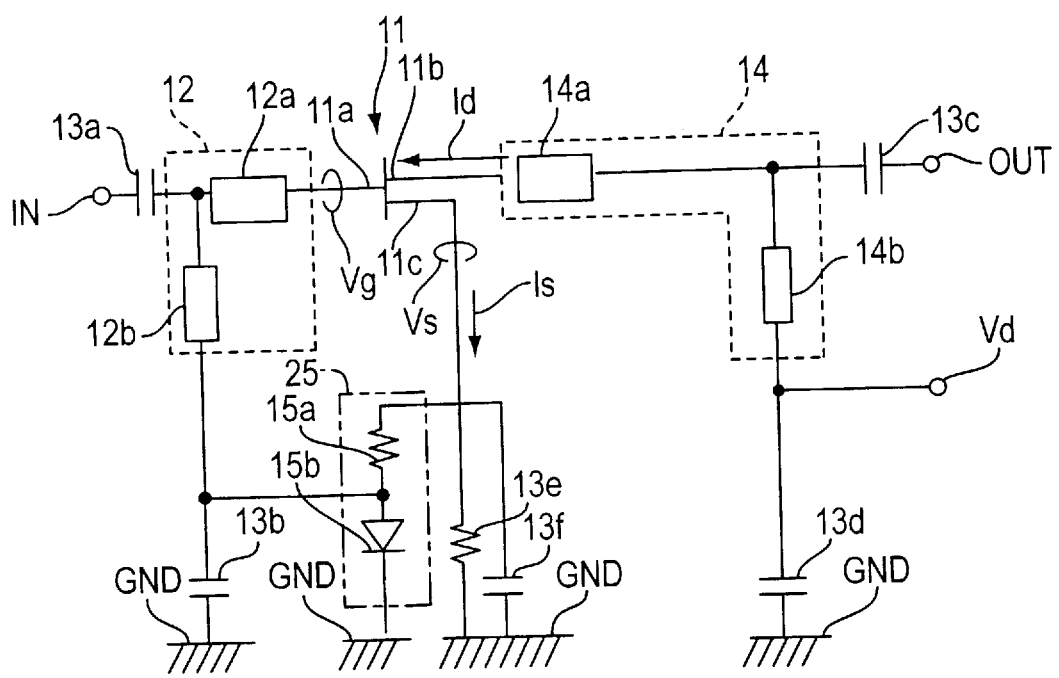
FIG. 5 is a circuit diagram showing the circuit arrangement of another amplifier circuit according to the present invention.

FIG. 5 illustrates another amplifier circuit embodying the present invention. The amplifier circuit implementing the second embodiment is similar in circuit arrangement to the first embodiment except for the connection of the gate bias circuit 25, and, for this reason, the circuit components of the second embodiment are labeled with the same references as those of the first embodiment without detailed description.

The gate bias circuit 25 produces the forward turn-on voltage Vf from the source potential Vs, and the forward turn-on voltage Vf is applied through the transmission lines 12b and 12a to the gate electrode 11a of the field effect transistor 11.

Figure 6:
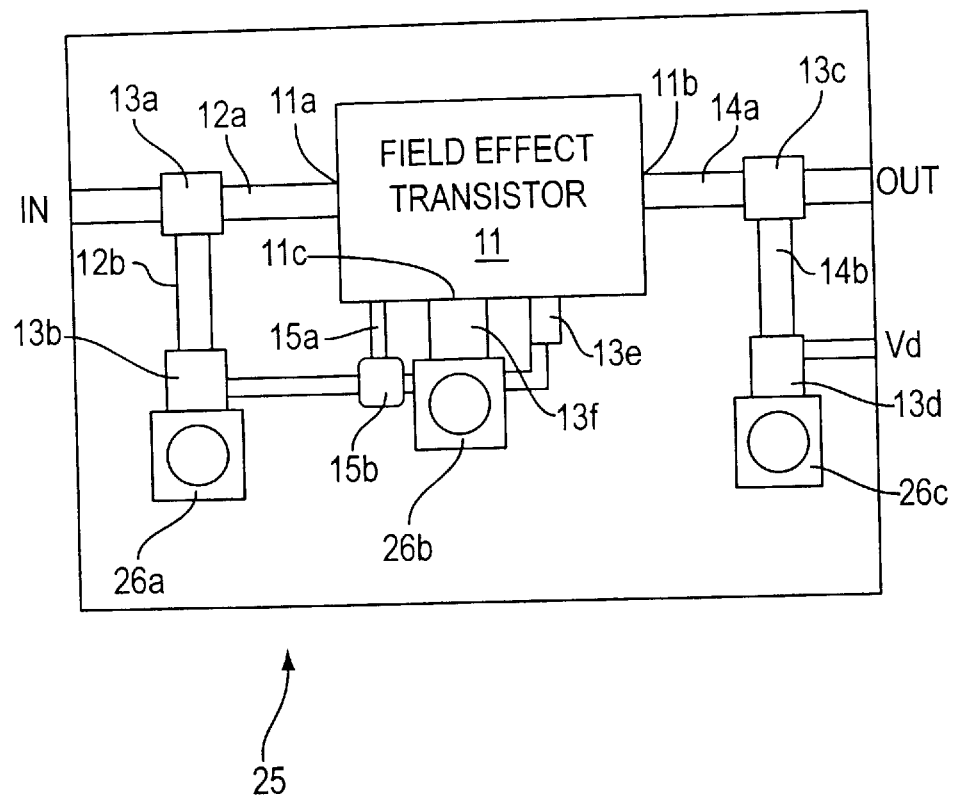
FIG. 6 is a plan view showing the layout of the amplifier circuit fabricated on a single semiconductor chip.

When the depletion type field effect transistor 11 is integrated on a single semiconductor chip together with other circuit components, the integrated circuit may have the layout shown in FIG. 6. In FIG. 6, the depletion type field effect transistor 11 is represented by a rectangular area, and the capacitor 13b, diode 15b/resistor 13e/capacitor 13f and the capacitor 13d are connected through via-holes 26a, 26b and 26c to a back plate (not shown) on the reverse surface of the semiconductor chip. The back plate is corresponding to the ground line GND in FIG. 2.

Comparing the layout shown in FIG. 6 with the layout shown in FIG. 3, the layout shown in FIG. 6 is simpler than the layout shown in FIG. 3, because the source electrode 11c is closer to the gate electrode 11a than the drain electrode 11b. A standard field effect transistor has a gate electrode and a drain electrode opposite to each other, and, accordingly, the drain electrode is farther to the gate electrode than the source electrode. In the first embodiment, the gate bias circuit 15 is connected to the power voltage line Vd closer to the drain electrode 11b, and requires a long conductive path to the transmission line 12b. However, the gate bias circuit 25 is connected to the source electrode 11c, and the conductive path between the gate bias circuit 25 and the transmission line 12b is shorter than that of the first embodiment.

Figure 7:
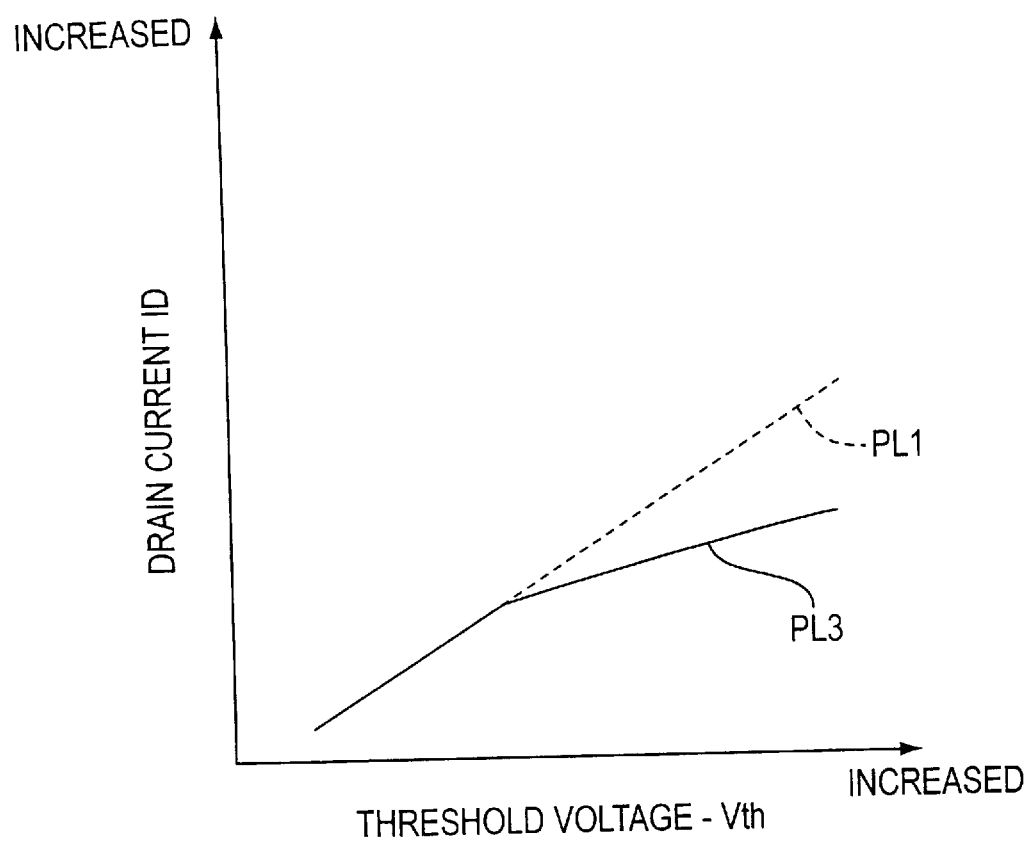
FIG. 7 is a graph showing variation of drain current in terms of the threshold of the field effect transistor.

The present inventor confirmed the improvement of the sensitivity for the amplifier circuit implementing the second embodiment. The present inventor prepared the amplifier circuit implementing the second embodiment, and measured the drain current Id for different threshold voltage Vth for the second embodiment and the prior art amplifier circuit. The drain current Id for the prior art amplifier circuit and the drain current Id for the second embodiment were plotted indicated by broken line (PL1) and real line (PL3) in FIG. 7. Comparing plots PL1 with plots PL3, although plots PL3 were overlapped with plots PL1 in the small thresholds, the range of drain current Id for the amplifier circuit of the second embodiment was narrower than the range of drain current Id for the prior art amplifier circuit as similar to the first embodiment. The reason why plots PL3 were overlapped with plots PL1 in the small threshold range is that the source potential Vs is too small to cause the diode 15b to turn on in the small threshold range.

Although particular embodiments of the present invention have been shown and described, it will be obvious to those skilled in the art that various changes and modifications may be made without departing from the spirit and scope of the present invention.

For example, equation 4 is applicable to an amplifier circuit having an enhancement type field effect transistor, and the gate bias circuit may be incorporated in the amplifier circuit having the enhancement type field effect transistor.

The diode may be a different type such as, for example, a Zener diode. When the Zener diode is used for the gate bias circuit, the Zener diode is inverted between the resistor 15a and the ground line GND. The capacitors 13b/13e/13d are used for discharging the alternating-current component to the ground line GND, and, therefore, they may be replaced with quarter-wave length open stubs or radial stubs which are used for the same purpose.

Finally, the transmission lines 12a/12b and 14a/14b may be replaced with concentrated constant elements such as an inductor, a capacitor and a resistor.

What is claimed is:

1. An amplifier circuit operative to amplify an input signal for producing an output signal, comprising:

a field effect transistor having a gate node supplied with said input signal from a signal input node, a source node for a source current and a drain node connected to a power voltage line for a drain current and supplying said output signal to a signal output node;

a first resistive element connected between said source node and a constant voltage source for providing a resistance against said source current; and a gate bias circuit powered by said sower voltage line, and having a diode element for applying a gate bias voltage to said gate node, said diode element having a first node electrically connected to said source node and said gate electrode and a second node connected to said constant voltage source.

2. An amplifier circuit operative to amplify an input signal for producing an output signal, comprising:

a field effect transistor having a gate node supplied with said input signal from a signal input node, a source node for a source current and a drain node connected to a power voltage line for a drain current and supplying said output signal to a signal output node;

a first resistive element connected between said source node and a constant voltage source for providing a resistance against said source current;

a gate bias circuit powered by said power voltage line, and having a diode element for applying a gate bias voltage to said gate node;

a first capacitive element connected to said signal input node;

a second capacitive element connected to said constant voltage source;

an input matching circuit having a first node electrically connected to said first capacitive element, a second node electrically connected to said gate node and a third node electrically connected to said second capacitive element, said gate bias voltage being supplied from said gate bias circuit through said input matching circuit to said gate note;

a third capacitive element connected to said signal output node;

a fourth capacitive element connected to said constant voltage source;

an output matching circuit having a first node electrically connected to said drain node, a second node electrically connected to said third capacitive element and a third node electrically connected to said fourth capacitive element, and said drain current being supplied from said power voltage line through said output matching circuit to said drain node; and a fifth capacitive element connected between said source node and said constant voltage source.

3. An amplifier circuit comprising:

a depletion type field effect transistor having a gate node, a source node and a drain node;

a first capacitive element connected to a signal input node to which an input signal is supplied;

a second capacitive element connected to a constant voltage source;

an input matching circuit having a first node connected to said first capacitive element, a second node connected to said gate node and a third node connected to said second capacitive element;

a third capacitive element connected to a signal output node to which an output signal is supplied from said drain node;

a fourth capacitive element connected to said constant voltage source;

an output matching circuit having a first node connected to said third capacitive element, a second node connected to said drain node and a third node connected to said fourth capacitive element and a power supply line so as to transfer a drain current from said power voltage line to said drain node;

a fifth capacitive element connected between said source node and said constant voltage source;

a first resistive element connected between said source node and said constant voltage source; and a series of a second resistive element and a diode element connected between said power voltage line and said constant voltage source so as to supply a gate bias voltage from a node between said second resistive element and said diode element to said third node of said input matching circuit.

4. An amplifier circuit comprising:

a depletion type field effect transistor having a gate node, a source node and a drain node;

a first capacitive element connected to a signal input node to which an input signal is supplied;

a second capacitive element connected to a constant voltage source;

an input matching circuit having a first node connected to said first capacitive element, a second node connected to said gate node and a third node connected to said second capacitive element;

a third capacitive element connected to a signal output node to which an output signal is supplied from said drain node;

a fourth capacitive element connected to said constant voltage source;

an output matching circuit having a first node connected to said third capacitive element, a second node connected to said drain node and a third node connected to said fourth capacitive element and a power supply line so as to transfer a drain current from said power voltage line to said drain node;

a fifth capacitive element connected between said source node and said constant voltage source;

a first resistive element connected between said source node and said constant voltage source; and a series of a second resistive element and a diode element connected between said source node and said constant voltage source so as to supply a gate bias voltage from a node between said second resistive element and said diode element to said third node of said input matching circuit.

* * * * *